United States Patent
Choy et al.

(10) Patent No.: US 9,191,007 B1
(45) Date of Patent: Nov. 17, 2015

(54) LATCHING LEVEL SHIFTER AND METHOD OF OPERATION

(71) Applicants: Jon S. Choy, Austin, TX (US); David W. Chrudimsky, Austin, TX (US)

(72) Inventors: Jon S. Choy, Austin, TX (US); David W. Chrudimsky, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/310,579

(22) Filed: Jun. 20, 2014

(51) Int. Cl.
*H03K 19/0175* (2006.01)
*H03K 19/0185* (2006.01)
*H03K 3/356* (2006.01)

(52) U.S. Cl.
CPC .... *H03K 19/018528* (2013.01); *H03K 3/35613* (2013.01); *H03K 19/018507* (2013.01); *H03K 19/018521* (2013.01)

(58) Field of Classification Search
None
See application file for complete search history.

(56) References Cited

U.S. PATENT DOCUMENTS

| | | | | |
|---|---|---|---|---|
| 5,444,408 | A * | 8/1995 | Merritt | 327/306 |
| 5,952,847 | A * | 9/1999 | Plants et al. | 326/80 |
| 6,169,432 | B1 | 1/2001 | Sharpe-Geisler | |
| 7,268,588 | B2 | 9/2007 | Sanchez et al. | |
| 7,446,566 | B1 | 11/2008 | Chrudimsky | |
| 7,733,126 | B1 * | 6/2010 | Choy et al. | 326/68 |
| 7,994,821 | B1 | 8/2011 | Wang et al. | |
| 8,395,434 | B1 * | 3/2013 | Nguyen et al. | 327/333 |
| 8,406,068 | B2 * | 3/2013 | Castaldo et al. | 365/189.11 |
| 8,575,962 | B2 * | 11/2013 | Yang et al. | 326/80 |
| 9,058,858 | B2 * | 6/2015 | Cheng et al. | 1/1 |
| 9,059,700 | B2 * | 6/2015 | Viani | 1/1 |

* cited by examiner

*Primary Examiner* — Vibol Tan

(57) ABSTRACT

A latching level shifter coupled to a first power supply voltage is driven by a logic circuit coupled to a second power supply voltage. The latching level shifter is driven in a first mode to store a state based on an input signal received by the logic circuit, the first and second power supply voltages are set at first and second initial voltage levels. The latching level shifter is driven in a second mode subsequent to the first mode, the first power supply voltage is set to an intermediate voltage level. The latching level shifter is driven in a high voltage protection mode to produce an output voltage based on the state, the first power supply voltage is set to a final voltage level that is greater than a final voltage level of the second power supply voltage. The high voltage protection mode is subsequent to the second mode.

20 Claims, 2 Drawing Sheets

LATCHING LEVEL SHIFTER AND METHOD OF OPERATION

BACKGROUND

1. Field

This disclosure relates generally to integrated circuits, and more specifically, to a latching level shifter.

2. Related Art

In many integrated circuit applications, level shifters are used to convert one voltage to another voltage. In some applications, level shifters are required to convert one voltage to a higher voltage that could result in damage to the devices within the level shifter. One current solution places each device that is susceptible to damage from the high voltages in its own isolated well. However, this results in increasingly large layouts which require greater circuit area. This results in increased size and cost and is thus undesirable. Therefore, a need exists for an improved level shifter capable of handling high voltages.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In order to minimize the number of individual isolated wells, one embodiment provides for a latching level shifter which increases the voltage power supply through an intermediate voltage level to a final voltage level. Prior to the increase of the voltage power supply from the intermediate voltage level to the final voltage level, a high voltage protect mode is enabled in order to achieve the ultimately higher final output voltage.

Figure 1:
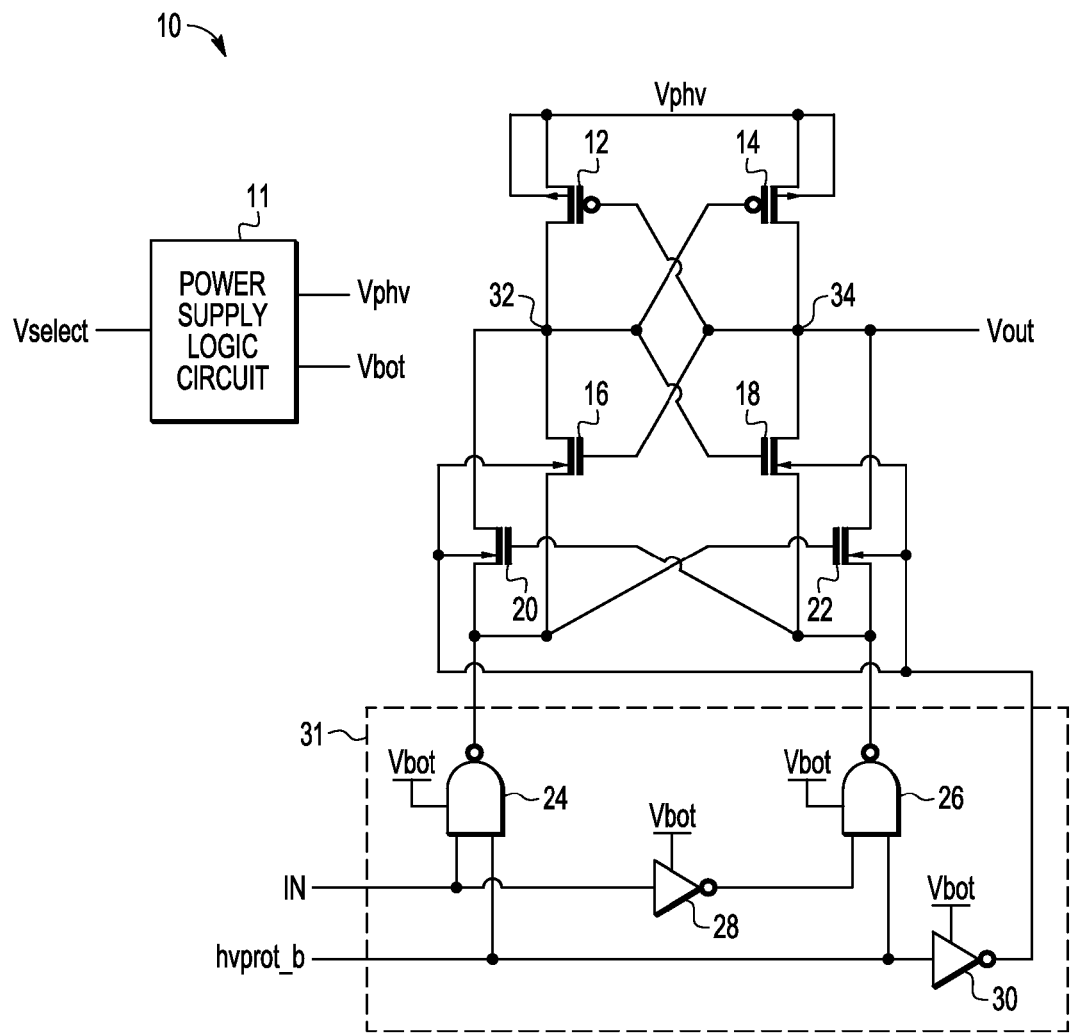
FIG. 1 illustrates, in schematic form, a latching level shifter in accordance with one embodiment of the present invention.

FIG. 1 illustrates a latching level shifter 10 in accordance with one embodiment of the present invention. Shifter 10 includes p-channel transistors 12 and 14, N-channel transistors 16, 18, 20, and 22, NAND gates 24 and 26, and inverters 28 and 30. Level shifter 10 may also include a power supply logic circuit 11. A first current electrode (e.g. a source electrode) of transistor 12 is coupled to a positive high voltage supply (Vphv) and to a well of transistor 12. A second current electrode of transistor 12 is coupled to a circuit node 32. A first current electrode (e.g. a source electrode) of transistor 14 is coupled to Vphv and to a well of transistor 14. A second current electrode of transistor 14 is coupled to a circuit node 34. Circuit node 34 provides an output voltage, Vout, of shifter 10. A control electrode of transistor 12 is coupled to node 34, and a control electrode of transistor 14 is coupled to 32. A first current electrode of transistor 16 is coupled to node 32, and a control electrode of transistor 16 is coupled to node 34. A first current electrode of transistor 18 is coupled to node 34, and a control electrode of transistor 18 is coupled to node 32. A first current electrode of transistor 20 is coupled to node 32, and a second current electrode of transistor 20 is coupled to a second current electrode of transistor 16, and a control electrode of transistor 20 is coupled to a second current electrode of transistor 18. A first current electrode of transistor 22 is coupled to node 34, a control electrode of transistor 22 is coupled to the second current electrode of transistor 20, and a second current electrode of transistor 22 is coupled to a second current electrode of transistor 18. NAND gate 24 has a first input coupled to receive input signal, IN, and a second input to receive a high voltage protection mode enable signal, hvprot_b. An output of NAND gate 24 is coupled to the second current electrodes of transistors 16 and 20. NAND gate 26 has a first input coupled to an output of inverter 28, and a second input coupled to receive hvprot_b. An output of NAND gate 24 is coupled to the second current electrodes of transistors 18 and 22. A first input of inverter 28 is coupled to receive IN. An input of inverter 30 is coupled to receive hvprot_b, and an output of inverter 30 is coupled to a well of transistor 16, a well of transistor 20, a well of transistor 18, and a well of transistor 22. Logic circuit 31 includes NAND gates 24 and 26 and inverters 28 and 30, in which logic circuit 31 drives level shifter 10 in response to IN and hvprot_b.

In operation, level shifter 10 provides Vout based on the value of IN. The state of the output voltage, Vout, corresponds to the state of the input signal, IN. When IN is a logic level low (e.g. 0V), level shifter 10 provides Vout at a low output voltage (i.e. a low state corresponding to the low state of IN), and when IN is a logic level high (e.g. 1.8V), level shifter 10 provides Vout at a high output voltage (i.e. a high state corresponding to the high state of IN). However, the high output voltage, if provided without protection, would be a voltage that would result in damage of the devices within level shifter 10. For example, level shifter 10 may need to provide a high output voltage of 14V for a particular application, such as for an erase operation. However, due to process technology, the maximum voltage drop capable of being handled by the devices within level shifter 10 may only be 9V, or some other voltage that is less than the high output voltage of 14V required by level shifter 10. Therefore, as will be seen below, a high voltage protection mode is used to protect the devices while outputting the high output voltage. Furthermore, note that the low output voltage provided when IN is a logic level low is a voltage that is lower than the high output voltage but is high enough such that the voltage difference between the high and low voltages does not result in damaging the devices. For example, the low output voltage may be 6V, in which the voltage difference between the high output voltage of 14V and the low output voltage of 6V does not exceed the maximum voltage of 9V capable of being handled by the devices. Note that power supply logic circuit 11 may be configured to set the voltage supply voltages, Vphv and Vbot, to appropriate voltage levels.

Figure 2:
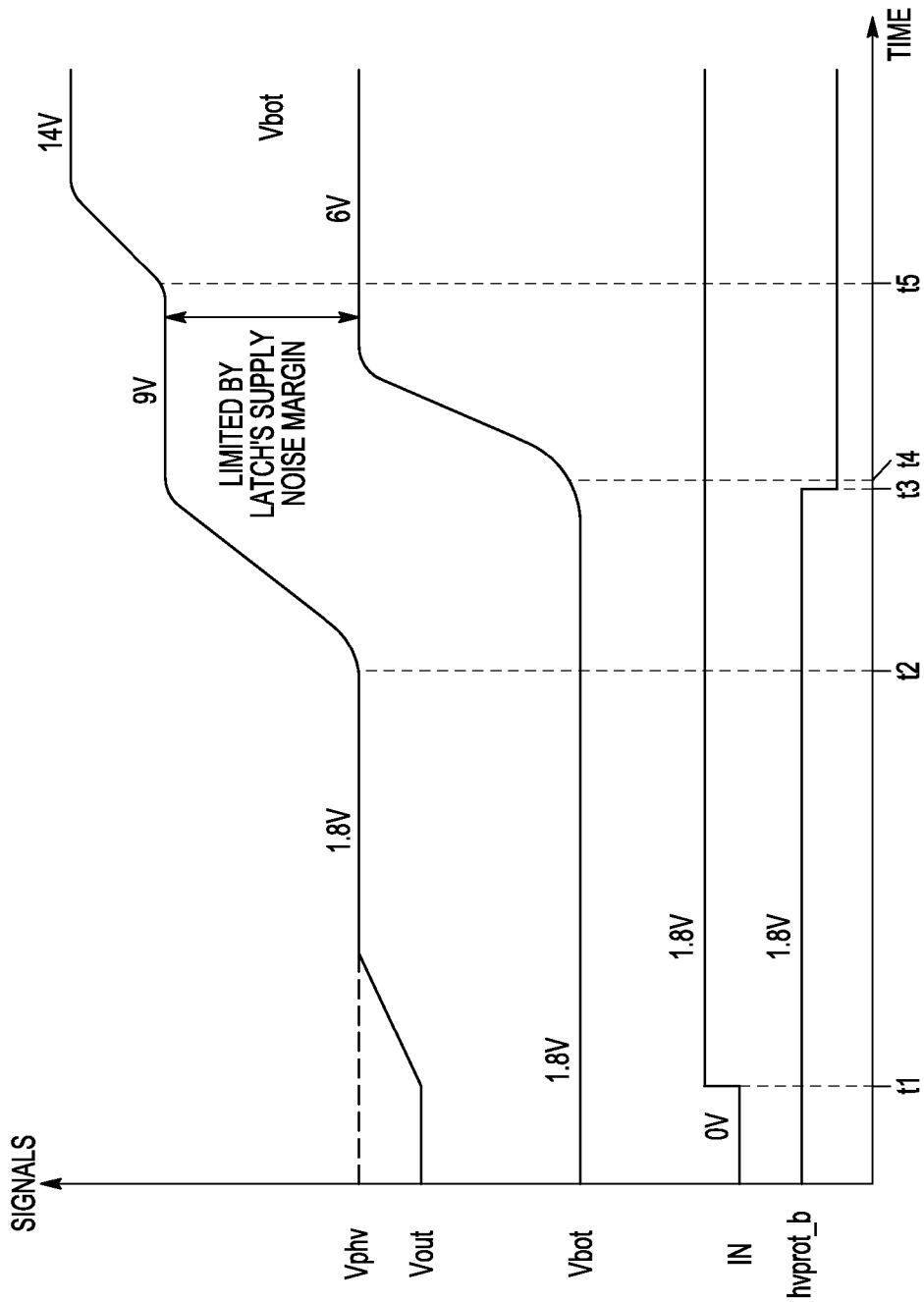
FIG. 2 illustrates, in diagrammatic form, various signals within the latching level shifter of FIG. 1.

Operation of FIG. 1 will be further described in reference to FIG. 2 which illustrates signals and voltage levels of level shifter 10 in accordance with one embodiment. Initially, IN is provided as a logic level low (e.g. 0V) and thus Vout is provided at a low of 0V. Also, the positive high voltage, Vphv, and the bottom voltage, Vbot, are provided at a first high voltage level of 1.8V. High voltage protection mode is not enabled, thus hvprot_b is a logic level high and inverter 30 outputs a logic level low. When the protection mode is not enabled, the wells of transistors 20 and 22 are grounded, and NAND gates 24 and 26 operate to invert the logic value at the first input. With IN at a logic level low, a logic level high is provided to the second current electrode of transistor 20 and the control electrode of transistor 22. In this manner, transistor 22 turns on, transistor 20 is cut off, and node 34 is pulled low. Therefore, Vout is 0V. At time t1, IN is asserted to a logic level one which initiates the transition of Vout to the high output voltage. Upon asserting IN, the output of NAND gate 24 becomes a logic level zero, and the output of NAND gate 26 becomes a logic level one. This results in turning on transistor 20 and cutting off transistor 22. Therefore, node 32 is now pulled low which turns on transistor 14. Transistor 14 pulls node 34 to Vphv (which is currently at 1.8V), thus providing Vout at 1.8V. At this point, the latch formed by transistors 12, 14, 16, and 18 stores the logic state of IN. Therefore, the duration of time after t1 (in which both Vphv and Vbot are at 1.8V) until the time at which the latch stores the logic state of IN (which occurs prior to reaching t2) may correspond to a first phase of level shifter 10. Note that the initial value of Vbot (1.8V in the current example) is at or below the value of IN, and the value of Vphv (1.8V in the current example) is a minimum logic voltage necessary for shifter 10 to store the logic state of IN.

At time t2, the value of Vphv is increased to a second high level of 9V, which may also be referred to as an intermediate high level. Therefore, during a second phase of level shifter 10, subsequent to the first phase, Vphv is set to the intermediate high level. This intermediate high level allows the latch formed by transistors 12, 14, 16, and 18, to continue to store the value corresponding to IN. Note that prior to increasing Vphv to the intermediate level, sufficient time is allowed in the first phase for Vout of level shifter 10 to settle at the first high voltage level. This may be done by providing a fixed amount of time or can be achieved by monitoring Vout and ensuring that Vout sufficiently settles at 1.8V.

Upon increasing Vphv to 9V, Vout tracks Vphv and also increases to the intermediate high voltage of 9V. However, the high output voltage of 14V has yet to be reached. This is achieved by increasing Vphv to an even higher voltage level. However, prior to doing so, a high voltage protection mode (also referred to as a high voltage protection phase) is entered at time t3 by asserting hvprot_b to a logic level zero. With hvprot_b asserted, the wells of transistors 16, 18, 20, and 22 are set to the value of Vbot which is still 1.8V. Also, upon asserting hvprot_b to a logic level 0, NAND gates 24 and 26 are a logic level high, regardless of the value of IN, and therefore operate to cut off both transistors 20 and 22. In this manner, note that Vout is maintained at the previously latched value and is no longer affected by the value of IN.

At time t4, after the high voltage protection mode is enabled, the value of Vbot is increased to a second (or final) bottom voltage level which corresponds to the low voltage level output by level shifter 10. Therefore, in the illustrated embodiment, Vbot is set to 6V. At time t5 (which occurs after Vbot has settled at 6V), Vphv is increased to the high (and final) voltage output level of 14V. However, since Vbot was previously increased to the second bottom voltage level, the voltage drop between 14V and 6V (rather than maintaining Vbot at the lower 1.8V) is too small to damage any of the devices. That is, the voltage difference between Vphv and Vbot at the time Vphv reaches its final voltage output level is less than a breakdown voltage of any of the devices of shifter 10. Vout tracks Vphv and thus achieves the high voltage level of 14V and does so without resulting in damage to the devices of shifter 10.

Referring back to time t1, if it is assumed that IN remains a logic level low, then the value latched by the transistors 12, 14, 16, and 18 would result in Vout remaining 0V until time t4. With protection mode enabled (as was described above) and Vbot being increased to 6V, Vout tracks Vbot and thus results in Vout being the low voltage level of 6V. In this manner, with IN being a logic level high, Vout is provided at the high voltage level of 14V and with IN being a logic level low, Vout is provided at the low voltage level of 6V. Due to the enabling of the high voltage protection mode by asserting hvprot_b, the devices of shifter 10 are not damaged.

Therefore, by now it should be understood how a level shifter may be driven by a logic circuit, such as logic circuit 31, in response to an input signal such as IN and a high voltage protect signal such as hvprot_b during a first phase, a second phase, and a high voltage protection phase to safely level shift an input voltage to a high voltage level which may, without protection, cause damage to devices of the level shifter.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a "_b" following the signal name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different configurations of logic circuit 31 may be used to appropriately drive level shifter 10. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit includes a latching level shifter coupled to a first power supply voltage, the latching level shifter configured to store a state during a first phase, and produce an output voltage based on the state during a high voltage protection phase; and a logic circuit coupled to the latching level shifter and to a second power supply voltage, the logic circuit configured to receive an input signal and a high voltage protection signal and to drive the latching level shifter in response to the input signal and the high voltage protection signal, the logic circuit further configured to drive the latching level shifter in the first phase to store the state, wherein the state is based on the input signal, the first power supply voltage is set to a first initial voltage level and the second power supply voltage is set to a second initial voltage level during the first phase, drive the latching level shifter in a second phase subsequent to the first phase, wherein the first power supply voltage is set to an intermediate voltage level that is greater than the first initial voltage level during the second phase, and drive the latching level shifter in the high voltage protection phase subsequent to the second phase to produce the output voltage, wherein the second power supply voltage is set to a first final voltage level that is greater than the second initial voltage level during the high voltage protection phase, the first power supply voltage is set to a second final voltage level that is greater than the first final voltage level during the high voltage protection phase, and a voltage difference between the first final voltage level and the second final voltage level is less than a breakdown voltage of the latching level shifter. In one aspect of the above embodiment, the logic circuit is triggered to drive the latching level shifter in the first phase in response to receipt of a transitioned value of the input signal, the logic circuit is triggered to drive the latching level shifter in the second phase in response to expiration of a time period measured from the receipt of the transitioned value of the input signal, the high voltage protection signal is clear in the first phase and in the second phase, and the logic circuit is triggered to drive the latching level shifter in the high voltage protection phase in response to the high voltage protection signal being set. In another aspect, the integrated circuit further includes a power supply logic circuit coupled to the first and second power supply voltages, the power supply logic circuit configured to set the first and second power supply voltages during the first, second, and high voltage protection phases. In another aspect, the second initial voltage level is set at or below the input signal, and the first initial voltage level is set at a minimum logic voltage necessary for the latching level shifter to store the state. In another aspect, the latching level shifter includes a first plurality of transistors and a second plurality of transistors, and the first plurality of transistors are of an opposite connectivity type than the second plurality of transistors. In a further aspect, wells of the first plurality of transistors are set at a negative power supply voltage level in the first phase, and the wells of the first plurality of transistors are set at the first final voltage level in the high voltage protection phase. In another further aspect, a well of each of the second plurality of transistors is tied to a source electrode of each of the second plurality of transistors, and the source electrodes of the second plurality of transistors are coupled to the first power supply voltage.

In another embodiment, an integrated circuit includes a first transistor having a control gate coupled to an output of a first NAND gate, having a first electrode coupled to an output of a second NAND gate, and having a second electrode; a second transistor having a control gate coupled to the output of the second NAND gate, having a first electrode coupled to the output of the first NAND gate, and having a second electrode coupled to an output node that provides an output voltage, wherein a first input of the second NAND gate is coupled to an input signal, a first input of the first NAND gate is coupled to an inverted version of the input signal, and the output voltage is based on the input signal; a third transistor having a control gate coupled to the second electrode of the second transistor, having a first electrode coupled to the output of the second NAND gate, and having a second electrode coupled to the second electrode of the first transistor; a fourth transistor having a control gate coupled to the second electrode of the first transistor, having a first electrode coupled to the output of the first NAND gate, and having a second electrode coupled to the second electrode of the second transistor; a fifth transistor having a control gate coupled to the second electrode of the fourth transistor, having a first electrode coupled to the second electrode of the third transistor, and having a second electrode; a sixth transistor having a control gate coupled to the second electrode of the third transistor, having a first electrode coupled to the second electrode of the fourth transistor, and having a second electrode coupled to the second electrode of the fifth transistor, wherein the second electrode of the fifth and sixth transistors are further coupled to a first power supply voltage; and a first inverter having an input coupled to a second input of the first NAND gate and a second input of the second NAND gate and having an output coupled to wells of the first, second, third, and fourth transistors, wherein the second input of the first NAND gate and the second input of the second NAND gate are coupled to a high voltage protection signal, and the first NAND gate, the second NAND gate, and the first inverter are further coupled to a second power supply voltage. In one aspect of the above another embodiment, the first power supply voltage provides a first initial voltage level and the second power supply voltage provides a second initial voltage level in response to receipt of a transitioned value of the input signal, the first power supply voltage provides an intermediate voltage level that is greater than the first initial voltage level after a time delay subsequent to the receipt of the transitioned value of the input signal, and the second power supply voltage provides a first final voltage level that is greater than the second initial voltage level and the first power supply voltage provides a second final voltage level that is greater than the first final voltage level in response to the high voltage protection signal being set. In a further aspect, a voltage difference between the first final voltage level and the second final voltage level is less than a break down voltage of the first, second, third, fourth, fifth, and sixth transistors. In another further aspect, the wells of the first, second, third, and fourth transistors are initially set at a negative power supply voltage level, and the wells of the first, second, third, and fourth transistors are set at the first final voltage level in response to the high voltage protection signal being set and the second power supply voltage being set to the first final voltage level. In yet another aspect of the above another embodiment, the integrated circuit further includes a second inverter having an input coupled to the first input of the second NAND gate and having an output coupled to the first input of the first NAND gate, wherein the output of the second inverter produces the inverted version of the input signal. In another aspect, a well of the fifth transistor is coupled to the second electrode of the fifth transistor, and a well of the sixth transistor is coupled to the second electrode of the sixth transistor. In another aspect, the first, second, third, and fourth transistors are of a first conductivity type, and the fifth and sixth transistors are of a second conductivity type that is opposite the first conductivity type.

In yet another embodiment, a method includes driving a latching level shifter in a first mode to store a state, wherein the latching level shifter is coupled to a first power supply voltage set at a first initial voltage level, the driving in the first mode is performed by a logic circuit coupled to a second power supply voltage set at a second initial voltage level, the logic circuit is configured to receive an input signal and a high voltage protection signal, and the state is based on the input signal; driving, by the logic circuit, the latching level shifter in a second mode subsequent to the driving in the first mode, wherein the driving in the second mode includes increasing the first power supply voltage to an intermediate voltage level; and driving, by the logic circuit, the latching level shifter in a high voltage protection mode to produce an output voltage based on the state, wherein the driving in the high voltage protection mode is performed subsequent to the driving in the second mode, the driving in the high voltage protection mode includes increasing the second power supply voltage to a first final voltage level, and increasing the first power supply voltage to a second final voltage level subsequent to the increasing the second power supply voltage, the second final voltage level is greater than the first final voltage level, and a difference between the first final voltage level and the second final voltage is less than a maximum voltage withstood by the latching level shifter. In one aspect of the above yet another embodiment, the driving in the first mode is triggered in response to receiving a transitioned value of the input signal and the high voltage protection signal being an inactive logic signal, the driving in the second mode is triggered in response to detecting expiration of a time period measured from the receipt of the transitioned value of the input signal, and the driving in the high voltage protection mode is triggered in response to detecting the high voltage protection signal is an active logic signal. In another aspect, the driving in the second mode is triggered in response to detecting the latching level shifter stores an active logic state. In another aspect, the driving in the second mode is triggered in response to detecting a voltage level of the output voltage corresponds to an active logic state. In another aspect, the latching level shifter includes a first set of transistors and a second set of transistors, the first set of transistors are of an opposite connectivity type as the second set of transistors, the logic circuit includes an inverter having an input coupled to the high voltage protection signal and having an output coupled to wells of the first set of transistors, and the inverter is further coupled to the second power supply voltage. In another aspect, the driving in the high voltage protection mode further includes raising the wells of the first plurality of transistors in response to the increasing the second power supply voltage to the first final voltage level and detecting the high voltage protection signal is an active logic signal.

What is claimed is:

1. An integrated circuit comprising:
   a latching level shifter coupled to a first power supply voltage, the latching level shifter configured to store a state during a first phase, and
   produce an output voltage based on the state during a high voltage protection phase; and
   a logic circuit coupled to the latching level shifter and to a second power supply voltage, the logic circuit configured to receive an input signal and a high voltage protection signal and to drive the latching level shifter in response to the input signal and the high voltage protection signal, the logic circuit further configured to
      drive the latching level shifter in the first phase to store the state, wherein
         the state is based on the input signal,
         the first power supply voltage is set to a first initial voltage level and the second power supply voltage is set to a second initial voltage level during the first phase,
      drive the latching level shifter in a second phase subsequent to the first phase, wherein
         the first power supply voltage is set to an intermediate voltage level that is greater than the first initial voltage level during the second phase, and
      drive the latching level shifter in the high voltage protection phase subsequent to the second phase to produce the output voltage, wherein
         the second power supply voltage is set to a first final voltage level that is greater than the second initial voltage level during the high voltage protection phase,
         the first power supply voltage is set to a second final voltage level that is greater than the first final voltage level during the high voltage protection phase, and
         a voltage difference between the first final voltage level and the second final voltage level is less than a breakdown voltage of the latching level shifter.

2. The integrated circuit of claim 1, wherein
   the logic circuit is triggered to drive the latching level shifter in the first phase in response to receipt of a transitioned value of the input signal,
   the logic circuit is triggered to drive the latching level shifter in the second phase in response to expiration of a time period measured from the receipt of the transitioned value of the input signal,
   the high voltage protection signal is clear in the first phase and in the second phase, and
   the logic circuit is triggered to drive the latching level shifter in the high voltage protection phase in response to the high voltage protection signal being set.

3. The integrated circuit of claim 1, further comprising
   a power supply logic circuit coupled to the first and second power supply voltages, the power supply logic circuit configured to
      set the first and second power supply voltages during the first, second, and high voltage protection phases.

4. The integrated circuit of claim 1, wherein
   the second initial voltage level is set at or below the input signal, and
   the first initial voltage level is set at a minimum logic voltage necessary for the latching level shifter to store the state.

5. The integrated circuit of claim 1, wherein
   the latching level shifter comprises a first plurality of transistors and a second plurality of transistors, and
   the first plurality of transistors are of an opposite connectivity type than the second plurality of transistors.

6. The integrated circuit of claim 5, wherein
   wells of the first plurality of transistors are set at a negative power supply voltage level in the first phase, and the wells of the first plurality of transistors are set at the first final voltage level in the high voltage protection phase.

7. The integrated circuit of claim 5, wherein
a well of each of the second plurality of transistors is tied to a source electrode of each of the second plurality of transistors, and
the source electrodes of the second plurality of transistors are coupled to the first power supply voltage.

8. An integrated circuit comprising:
a first transistor having a control gate coupled to an output of a first NAND gate, having a first electrode coupled to an output of a second NAND gate, and having a second electrode;
a second transistor having a control gate coupled to the output of the second NAND gate, having a first electrode coupled to the output of the first NAND gate, and having a second electrode coupled to an output node that provides an output voltage, wherein
   a first input of the second NAND gate is coupled to an input signal,
   a first input of the first NAND gate is coupled to an inverted version of the input signal, and
   the output voltage is based on the input signal;
a third transistor having a control gate coupled to the second electrode of the second transistor, having a first electrode coupled to the output of the second NAND gate, and having a second electrode coupled to the second electrode of the first transistor;
a fourth transistor having a control gate coupled to the second electrode of the first transistor, having a first electrode coupled to the output of the first NAND gate, and having a second electrode coupled to the second electrode of the second transistor;
a fifth transistor having a control gate coupled to the second electrode of the fourth transistor, having a first electrode coupled to the second electrode of the third transistor, and having a second electrode;
a sixth transistor having a control gate coupled to the second electrode of the third transistor, having a first electrode coupled to the second electrode of the fourth transistor, and having a second electrode coupled to the second electrode of the fifth transistor, wherein
   the second electrode of the fifth and sixth transistors are further coupled to a first power supply voltage; and
a first inverter having an input coupled to a second input of the first NAND gate and a second input of the second NAND gate and having an output coupled to wells of the first, second, third, and fourth transistors, wherein
   the second input of the first NAND gate and the second input of the second NAND gate are coupled to a high voltage protection signal, and
   the first NAND gate, the second NAND gate, and the first inverter are further coupled to a second power supply voltage.

9. The integrated circuit of claim 8, wherein
the first power supply voltage provides a first initial voltage level and the second power supply voltage provides a second initial voltage level in response to receipt of a transitioned value of the input signal,
the first power supply voltage provides an intermediate voltage level that is greater than the first initial voltage level after a time delay subsequent to the receipt of the transitioned value of the input signal, and
the second power supply voltage provides a first final voltage level that is greater than the second initial voltage level and the first power supply voltage provides a second final voltage level that is greater than the first final voltage level in response to the high voltage protection signal being set.

10. The integrated circuit of claim 9, wherein
a voltage difference between the first final voltage level and the second final voltage level is less than a break down voltage of the first, second, third, fourth, fifth, and sixth transistors.

11. The integrated circuit of claim 9, wherein
the wells of the first, second, third, and fourth transistors are initially set at a negative power supply voltage level, and
the wells of the first, second, third, and fourth transistors are set at the first final voltage level in response to the high voltage protection signal being set and the second power supply voltage being set to the first final voltage level.

12. The integrated circuit of claim 8, further comprising
a second inverter having an input coupled to the first input of the second NAND gate and having an output coupled to the first input of the first NAND gate, wherein
   the output of the second inverter produces the inverted version of the input signal.

13. The integrated circuit of claim 8, wherein
a well of the fifth transistor is coupled to the second electrode of the fifth transistor, and
a well of the sixth transistor is coupled to the second electrode of the sixth transistor.

14. The integrated circuit of claim 8, wherein
the first, second, third, and fourth transistors are of a first conductivity type, and
the fifth and sixth transistors are of a second conductivity type that is opposite the first conductivity type.

15. A method comprising:
driving a latching level shifter in a first mode to store a state, wherein
   the latching level shifter is coupled to a first power supply voltage set at a first initial voltage level,
   the driving in the first mode is performed by a logic circuit coupled to a second power supply voltage set at a second initial voltage level,
   the logic circuit is configured to receive an input signal and a high voltage protection signal, and
   the state is based on the input signal;
driving, by the logic circuit, the latching level shifter in a second mode subsequent to the driving in the first mode, wherein
   the driving in the second mode comprises
     increasing the first power supply voltage to an intermediate voltage level; and
driving, by the logic circuit, the latching level shifter in a high voltage protection mode to produce an output voltage based on the state, wherein
   the driving in the high voltage protection mode is performed subsequent to the driving in the second mode,
   the driving in the high voltage protection mode comprises
     increasing the second power supply voltage to a first final voltage level, and
     increasing the first power supply voltage to a second final voltage level subsequent to the increasing the second power supply voltage,
   the second final voltage level is greater than the first final voltage level, and
   a difference between the first final voltage level and the second final voltage is less than a maximum voltage withstood by the latching level shifter.

16. The method of claim 15, wherein
the driving in the first mode is triggered in response to receiving a transitioned value of the input signal and the high voltage protection signal being an inactive logic signal,
the driving in the second mode is triggered in response to detecting expiration of a time period measured from the receipt of the transitioned value of the input signal, and
the driving in the high voltage protection mode is triggered in response to detecting the high voltage protection signal is an active logic signal.

17. The method of claim 15, wherein
the driving in the second mode is triggered in response to detecting the latching level shifter stores an active logic state.

18. The method of claim 15, wherein
the driving in the second mode is triggered in response to detecting a voltage level of the output voltage corresponds to an active logic state.

19. The method of claim 15, wherein
the latching level shifter comprises a first set of transistors and a second set of transistors,
the first set of transistors are of an opposite connectivity type as the second set of transistors,
the logic circuit comprises an inverter having an input coupled to the high voltage protection signal and having an output coupled to wells of the first set of transistors, and
the inverter is further coupled to the second power supply voltage.

20. The method of claim 19, wherein
the driving in the high voltage protection mode further comprises
raising the wells of the first plurality of transistors in response to the increasing the second power supply voltage to the first final voltage level and detecting the high voltage protection signal is an active logic signal.

* * * * *